(12) United States Patent
Numata et al.

(10) Patent No.: US 11,435,251 B2
(45) Date of Patent: Sep. 6, 2022

(54) CONTROL APPARATUS, ARRAY-TYPE SENSOR, SENSOR USAGE METHOD, CONTROL METHOD, AND PROGRAM

(71) Applicant: NEC CORPORATION, Tokyo (JP)

(72) Inventors: Hideaki Numata, Tokyo (JP); Hiroyuki Endoh, Tokyo (JP)

(73) Assignee: NEC CORPORATION, Tokyo (JP)

( * ) Notice: Subject to any disclaimer, the term of this patent is extended or adjusted under 35 U.S.C. 154(b) by 252 days.

(21) Appl. No.: 16/644,425

(22) PCT Filed: Sep. 13, 2017

(86) PCT No.: PCT/JP2017/032950
§ 371 (c)(1),
(2) Date: Mar. 4, 2020

(87) PCT Pub. No.: WO2019/053794
PCT Pub. Date: Mar. 21, 2019

(65) Prior Publication Data
US 2021/0072108 A1 Mar. 11, 2021

(51) Int. Cl.
*G01L 25/00* (2006.01)
*G01L 1/22* (2006.01)
*G11C 13/00* (2006.01)

(52) U.S. Cl.
CPC ............ *G01L 25/00* (2013.01); *G01L 1/2268* (2013.01); *G01L 1/2287* (2013.01); *G11C 13/003* (2013.01); *G11C 13/004* (2013.01)

(58) Field of Classification Search
CPC ..... G01L 25/00; G01L 1/2268; G01L 1/2287; G11C 13/003; G11C 13/004
See application file for complete search history.

(56) References Cited

U.S. PATENT DOCUMENTS 5,167,287 A * 12/1992 Pomies .................. G01G 19/10
 177/1
11,217,235 B1 * 1/2022 Chu ...................... G05D 1/0016
(Continued)

FOREIGN PATENT DOCUMENTS

JP 63-030719 A 2/1988
JP 2002-328045 A 11/2002
(Continued)

OTHER PUBLICATIONS

Japanese Office Action for JP Application No. 2019-541528 dated May 25, 2021 with English Translation.
(Continued)

*Primary Examiner* — Max H Noori
(74) *Attorney, Agent, or Firm* — Sughrue Mion, PLLC

(57) ABSTRACT

A control apparatus controls an array-type sensor. The control apparatus includes: a first selector/driver that is configured to select and drive one of a plurality of first lines; a second selector/driver that is configured to select and drive at least one of a plurality of second lines; a read/arithmetic circuit that is configured to read outputs of respective unit cells and perform a correction operation on the outputs; and a nonvolatile storage device that is configured to store reference data. The sensor outputs of the respective unit cells with respect to two or more reference inputs are stored as reference data in the nonvolatile storage device in a calibration mode, and a correction operation is performed on the sensor outputs of the respective unit cells using the stored reference data and results of the correction operation are output in a measurement mode.

12 Claims, 10 Drawing Sheets

(56) References Cited

U.S. PATENT DOCUMENTS

| | | | | |
|---|---|---|---|---|
| 11,219,151 | B1* | 1/2022 | Saketi | H01L 21/67144 |
| 2009/0112115 | A1* | 4/2009 | Huang | A61B 5/083 |
| | | | | 600/532 |
| 2012/0075441 | A1* | 3/2012 | Lenhert | G01N 21/4788 |
| | | | | 348/61 |
| 2014/0250279 | A1* | 9/2014 | Manning | G11C 11/4091 |
| | | | | 711/154 |
| 2018/0005669 | A1* | 1/2018 | Hush | G11C 7/065 |
| 2018/0107379 | A1* | 4/2018 | Jia | G06F 3/04166 |
| 2020/0072925 | A1* | 3/2020 | Julian | G01R 33/3802 |
| 2021/0166773 | A1* | 6/2021 | Xu | G11C 11/5628 |

FOREIGN PATENT DOCUMENTS

| | | |
|---|---|---|
| JP | 2004-347567 A | 12/2004 |
| JP | 2005-150146 A | 6/2005 |
| JP | 2006-184273 A | 7/2006 |
| JP | 2008-214177 A | 9/2008 |
| JP | 2014-062816 A | 4/2014 |
| JP | 2014-228454 A | 12/2014 |

OTHER PUBLICATIONS

International Search Report received in corresponding International Application No. PCT/JP2017/032950 dated Nov. 21, 2017.

* cited by examiner

CONTROL APPARATUS, ARRAY-TYPE SENSOR, SENSOR USAGE METHOD, CONTROL METHOD, AND PROGRAM

CROSS REFERENCE TO RELATED APPLICATIONS

This application is a National Stage of International Application No. PCT/JP2017/032950 filed Sep. 13, 2017.

TECHNICAL FIELD

The present invention relates to a control apparatus, an array-type sensor, a sensor usage method, a control method, and a program.

BACKGROUND ART

In general, an array-type sensor in which unit cells including select transistors and sensor elements are two-dimensionally arranged is known.

For example, Patent Document 1 discloses a technology of a pressure sensor sheet in which pressure-sensitive cells obtained by combining TFTs and strain gauges are arranged in a two-dimensional matrix form such that pressures at multiple points can be detected.

PRIOR ART DOCUMENTS

Patent Documents

[Patent Document 1] Japanese Unexamined Patent Application, First Publication No. 2014-228454

SUMMARY OF THE INVENTION

Problem to be Solved by the Invention

The array-type sensor disclosed in Patent Document 1 detects a potential difference between both ends of the strain gauge of each cell and an output of a bridge circuit having the strain gauge incorporated therein and detects a pressure applied to each pressure-sensitive cell.

However, the outputs of respective cells may vary for the same pressure due to characteristics variation in each sensor element, characteristics variation in each select transistor, resistance variation in each connecting line, and the like. Accordingly, the outputs of the array-type sensor disclosed in Patent Document 1 are not uniform for respective cells.

The present invention provides a control apparatus, an array-type sensor, a sensor usage method, a control method, and a program which can obtain uniform outputs in respective cells of an array-type sensor.

Means for Solving the Problem

A control apparatus of a first aspect is a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, wherein sensor outputs of the respective unit cells with respect to two or more reference inputs are stored as the reference data in the nonvolatile storage device in a calibration mode, and a correction operation is performed on the sensor outputs of the respective unit cells using the reference data stored in the nonvolatile storage device and results of the correction operation are output in a measurement mode.

A control method of a second aspect is a control method of a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, the control method executing: a calibration step of storing sensor outputs of the respective unit cells with respect to two or more reference inputs as the reference data in the nonvolatile storage device in a calibration mode; and a measurement step of performing a correction operation on the sensor outputs of the respective unit cells using the reference data stored in the nonvolatile storage device and outputting results of the correction operation in a measurement mode.

A program of a third aspect is a program causing a computer of a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, to execute: a calibration step of storing sensor outputs of the respective unit cells with respect to two or more reference inputs as the reference data in the nonvolatile storage device in a calibration mode; and a measurement step of performing a correction operation on the sensor outputs of the respective unit cells using the reference data stored in the nonvolatile storage device and outputting results of the correction operation in a measurement mode.

Effect of the Invention

The above-described control apparatus, array-type sensor, sensor usage method, control method and program allow uniform outputs of respective cells of an array-type sensor to be obtained.

EMBODIMENTS FOR CARRYING OUT THE INVENTION

Hereinafter, configurations and operations of array-type sensors of various embodiments of the present invention will be described using the drawings.

First Embodiment

Hereinafter, a first embodiment of an array-type sensor will be described with reference to FIG. 1 to FIG. 7.

Figure 1:
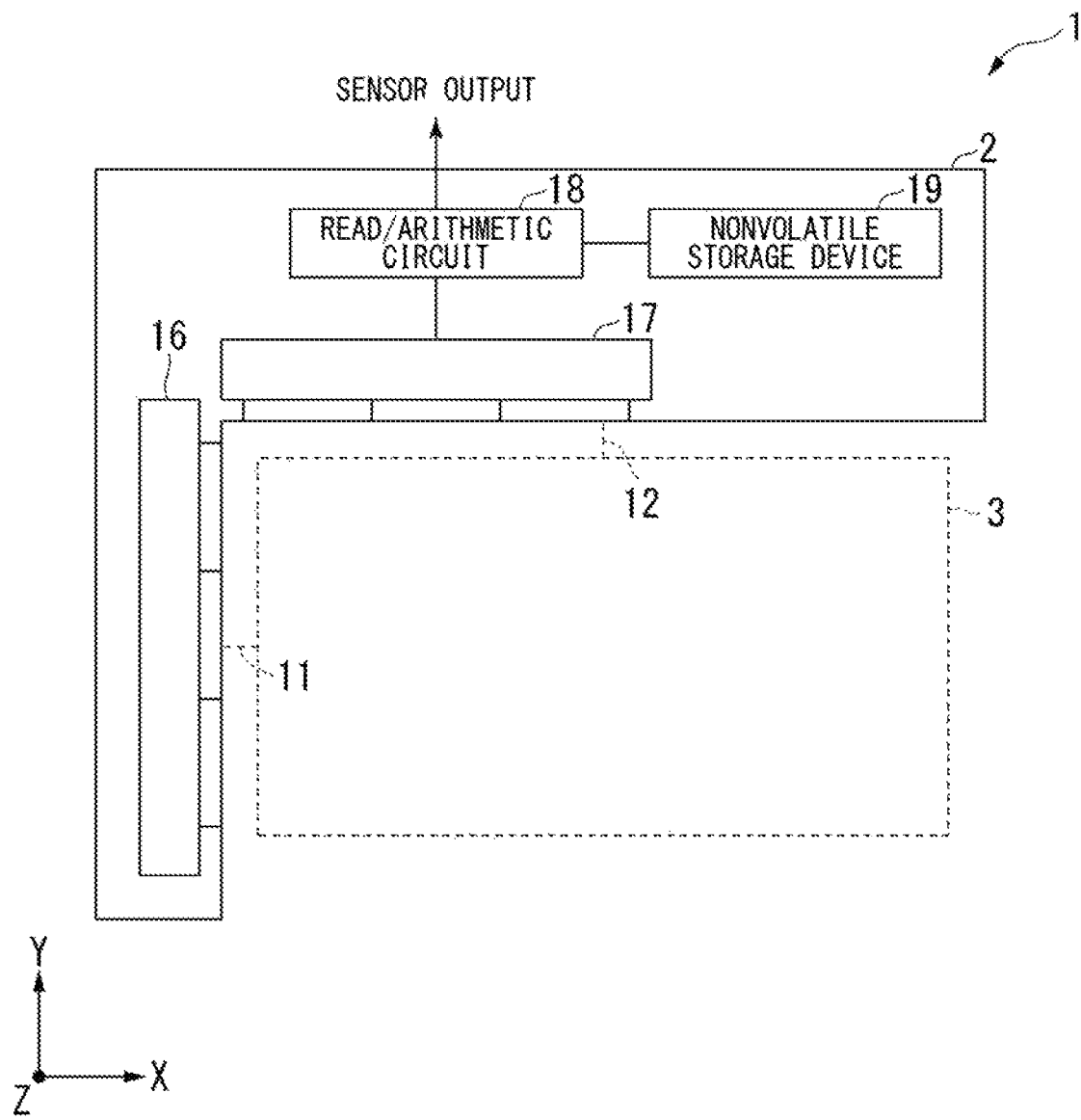
FIG. 1 is a schematic diagram of a control apparatus according to a first embodiment.
Figure 2:
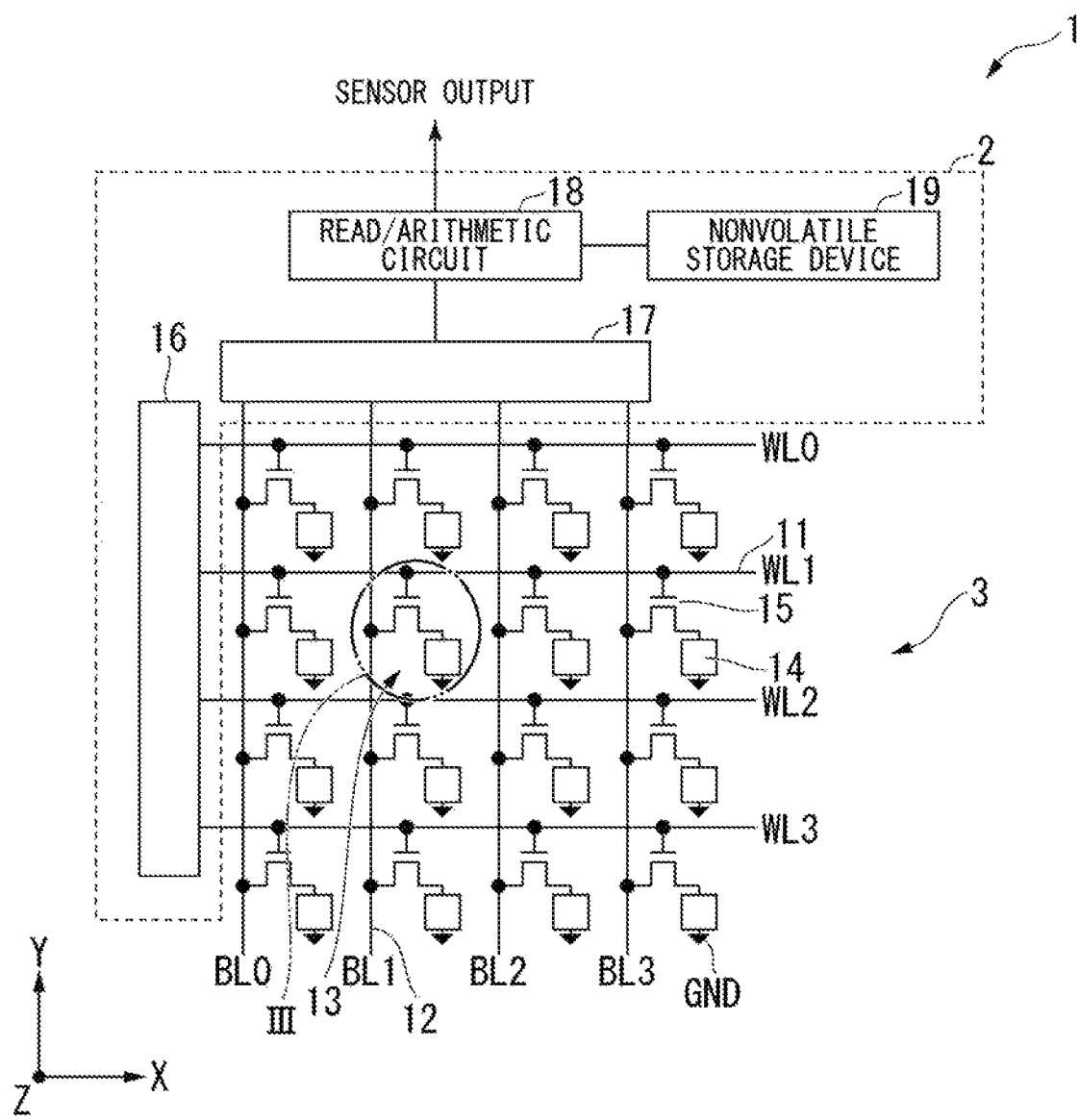
FIG. 2 is a schematic diagram of an array-type sensor according to the first embodiment.

As shown in FIG. 1 and FIG. 2, the array-type sensor 1 of the present embodiment includes a control apparatus 2, an array part 3, word lines 11 (first lines), and bit lines 12 (second lines).

(Array Part)

As shown in FIG. 2, the array part 3 includes sixteen unit cells 13 in the present embodiment. The unit cells 13 are two-dimensionally arranged in four lines in the X direction and four lines in the Y direction.

Each unit cell 13 includes a sensor element 14 and a select transistor 15.

Each select transistor 15 is a thin film transistor (TFT) and includes a drain, a source and a gate.

The gates of the respective select transistors 15 are connected to the word lines The drains of the respective select transistors 15 are connected to the bit lines 12.

In each unit cell 13, the source of the select transistor 15 is connected to the sensor element 14.

The sensor element 14 is an element having a resistance value varying according to an external stimulus (input load). The sensor element 14 includes a first end and a second end.

For example, the sensor element 14 may be a pressure sensor element in which a resistance value between the first end and the second end decreases when it is deformed by pressure applied thereto.

Figure 3:
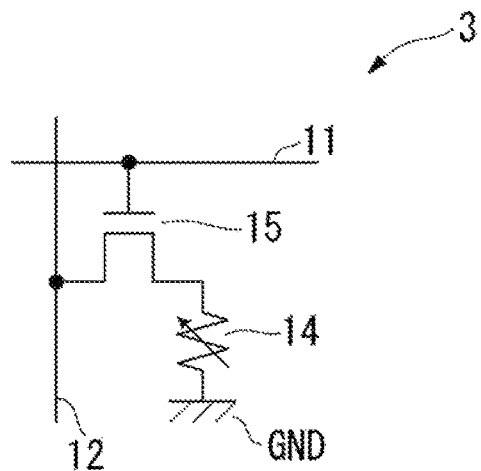
FIG. 3 is an enlarged view of a part III of FIG. 2.

Accordingly, the sensor element 14 is equivalent to a variable resistor, as shown in FIG. 3.

In the case of the present embodiment, the first end of the sensor element 14 is connected to the source of the select transistor 15. The second end of the sensor element 14 is connected to the ground GND at a ground potential which is the same as for other sensor elements 14.

(Word Line)

The word lines 11 are lines extending in the X direction. In the present embodiment, four word lines 11 of WL0, WL1, WL2 and WL3 are arranged in the Y direction. Each word line 11 is provided at a position in relation to each unit cell 13 in the Y direction.

(Bit Line)

The bit lines 12 are lines extending in the Y direction. In the present embodiment, four bit lines 12 of BL0, BL1, BL2 and BL3 are arranged in the X direction. Each bit line 12 is provided at a position in relation to each unit cell 13 in the X direction.

In the present embodiment, the word lines 11 and the bit lines 12 are arranged in an intersecting manner orthogonally.

(Control Apparatus)

The control apparatus 2 includes a first selector/driver 16, a second selector/driver 17, a read/arithmetic circuit 18 and a nonvolatile storage device 19.

The first selector/driver 16 selects and drives one of the word lines 11. Specifically, the first selector/driver 16 causes a select transistor whose gate is connected to a selected word line 11 to be in an ON state.

The second selector/driver 17 selects and drives at least one of the bit lines 12. Specifically, the second selector/driver 17 applies a read voltage to a selected bit line 12.

For example, when the output of the sensor element 14 of the unit cell 13 disposed at the intersection point of the word line 11 and the bit line 12 in a part III of FIG. 2 is read, the first selector/driver 16 selects WL1 from among the word lines 11 and causes the select transistor 15 whose gate is connected to WL1 to be in an ON state. Simultaneously, the second selector/driver 17 selects BL1 from among the bit lines 12 and applies a read voltage to BL1.

Select transistors 15 other than those in the part III from among the select transistors 15 connected to BL1 are not provided with a voltage through gates thereof and thus they are in an OFF state. Accordingly, current flows only through the sensor element 14 of the unit cell 13 selected through both WL1 and BL1.

As described above, the sensor element 14 is equivalent to a variable resistor. Accordingly, it is possible to ascertain the resistance value of the sensor element 14 by measuring, as a sensor output, a value of current which passes through BL1, the select transistor 15 and the sensor element 14 and drains into the ground GND for the read voltage applied by the second selector/driver 17 to BL1 through the read/arithmetic circuit 18. If a relationship between load input values and current values obtained by measurement is known in advance, it is possible to quantitatively determine an input value of a load applied to the sensor element 14 by measuring a current value.

The read/arithmetic circuit 18 reads sensor outputs of the respective unit cells 13 and performs a correction operation thereon.

The read/arithmetic circuit 18 measures (reads) sensor outputs of the respective unit cells 13 with respect to two or more reference inputs, transmits the sensor outputs to the nonvolatile storage device 19 and stores the sensor outputs therein as reference data in a calibration mode.

The read/arithmetic circuit 18 measures (reads) sensor outputs of the respective unit cells 13 in a measurement mode. On the other hand, the read/arithmetic circuit 18 reads reference data stored in the nonvolatile storage device 19 and performs a correction operation on measured sensor outputs of the respective unit cells 13.

The read/arithmetic circuit 18 outputs sensor outputs on which the correction calculation has been performed to the outside.

The nonvolatile storage device 19 stores reference data.

The nonvolatile storage device 19 stores sensor outputs of the respective unit cells 13 with respect to two or more reference inputs as reference data in the calibration mode.

In addition, the reference data stored in the nonvolatile storage device 19 is used for the correction operation performed on the sensor outputs of the respective unit cells 13 in the measurement mode.

In the present embodiment, a nonvolatile memory may be used as the nonvolatile storage device 19.

(Control Method)

A control method of the control apparatus 2 will be described.

(Calibration Mode)

Figure 4:
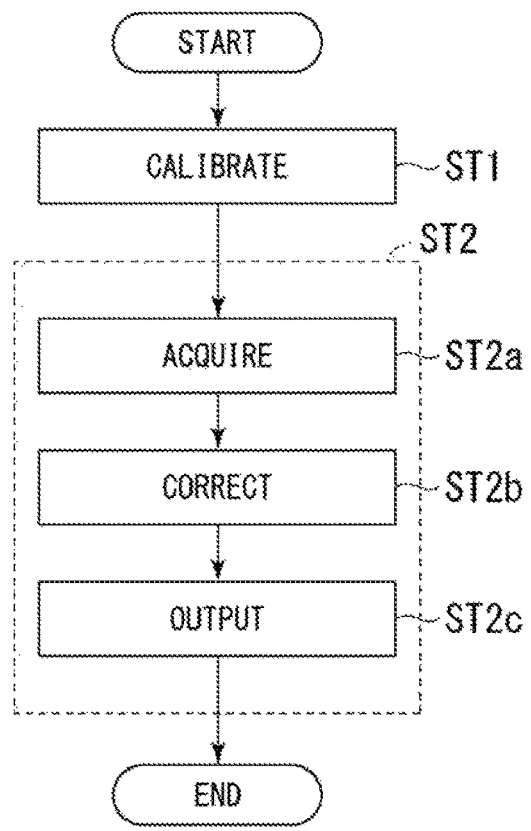
FIG. 4 is a flowchart of a control method in the control apparatus according to the first embodiment.

As shown in FIG. 4, the control apparatus 2 executes a calibration step ST1 as a calibration mode first.

In the calibration step ST1, sensor outputs of the respective unit cells 13 are read and stored as reference data in the nonvolatile storage device 19 in an initial no-load state.

Next, a reference input load is applied to the respective cell elements 14 and sensor outputs of the respective unit cells 13 are read and stored as reference data in the nonvolatile storage device 19.

(Measurement Mode)

Subsequently to calibration step ST1, the control apparatus 2 executes a measurement step ST2 as a measurement mode.

In the measurement step ST2, first, the control apparatus 2 acquires raw sensor outputs of the respective unit cells 13 (ST2a: acquisition step).

Subsequently to acquisition step ST2a, the control apparatus 2 reads sensor outputs acquired when no load is applied and when the reference input load is applied and stored in advance in the nonvolatile storage device 19 and performs a correction operation on the raw sensor outputs through the read/arithmetic circuit 18 (ST2b: correction step).

Subsequently to the correction step ST2b, the control apparatus 2 outputs the corrected sensor outputs to the outside (ST2c: output step).

(Operation and Effects)

Thin film transistors (TFTs) are widely used as pixel switching elements for display devices such as a liquid crystal display. Such TFTs are formed on a glass substrate using amorphous or polycrystalline silicon. A CVD apparatus used to manufacture TFTs using silicon is considerably expensive, and increasing the area for TFTs causes considerable manufacturing cost increase.

In addition, there is a limitation that plastic substrates or the like cannot be used because a process of forming amorphous or polycrystalline silicon film is performed at a very high temperature.

However, the development of recent printing electronics technology enables formation of TFTs which is difficult to perform on a large-area substrate through a manufacturing method using photolithography or a vacuum process.

Furthermore, since a process temperature is low, flexible and light plastic substrates can be used and thus development of new applications of TFTs is expected.

On the other hand, demand for surface-type sensor devices as represented by touch panels of smartphones and tablet terminals is increasing. However, although such touch panels use a resistive film type, a capacitive type or the like and thus are highly practical as inexpensive and light position detection devices, they are not suitable for purposes such as simultaneous detection of pressures at multiple points.

Specifically, in an array-type sensor in which unit cells 13 each including the sensor element 14 and the select transistor 15 are two-dimensionally arranged, an output from the sensor element 14 of each unit cell 13 is basically detected through the select transistor 15 of each unit cell 13 and connecting lines. In this array-type sensor, all variations such as characteristics variation in the sensor elements 14, characteristics variation in the select transistors 15 and resistance variation in connecting lines cause errors in each sensor (each unit cell 13).

Particularly, as the array-type sensor becomes large, line resistance increases and line lengths are considerably different in places. In addition, when the size and area of the array-type sensor increase, variations during manufacture of the sensor elements 14 and the select transistors 15 considerably easily increase and uniformity and the accuracy of outputs detected by the read/arithmetic circuit are considerably difficult to maintain. Accordingly, different outputs are obtained with respect to the same load input and thus it is impossible to reduce a range of gradation representation for load inputs and obtain two-dimensional information which secures practical precision. Consequently, a large amount of investment and technical development are required in order to sufficiently improve uniformity of characteristics of the sensor elements 14 and the select transistors 15 and uniformity of resistances of connecting lines.

Furthermore, element characteristics and the like degrade over time according to situations and environments in which the array-type sensor is used. As a result, detection accuracy decreases. In the array-type sensor, deterioration of one unit cell 13 generates defects in a two-dimensional output map. Consequently, the life of the array-type sensor is shorter than that of a general single-element sensor.

For example, current flowing through the sensor elements 14 when WL1 and BL1 are selected and when WL3 and BL1 are selected will be described as an example.

Although the current passes through the same bit line BL1 in both cases, a current flow length (path) when WL3 is selected is about twice that when WL1 is selected.

Accordingly, line resistance greatly contributes to current flow and thus detected current decreases when WL3 is selected as compared to a case in which WL1 is selected for the same load input.

In this manner, place dependency of line resistance increases as the size of the array-type sensor increases and thus a difference from a standard sensor output increases.

Figure 5:
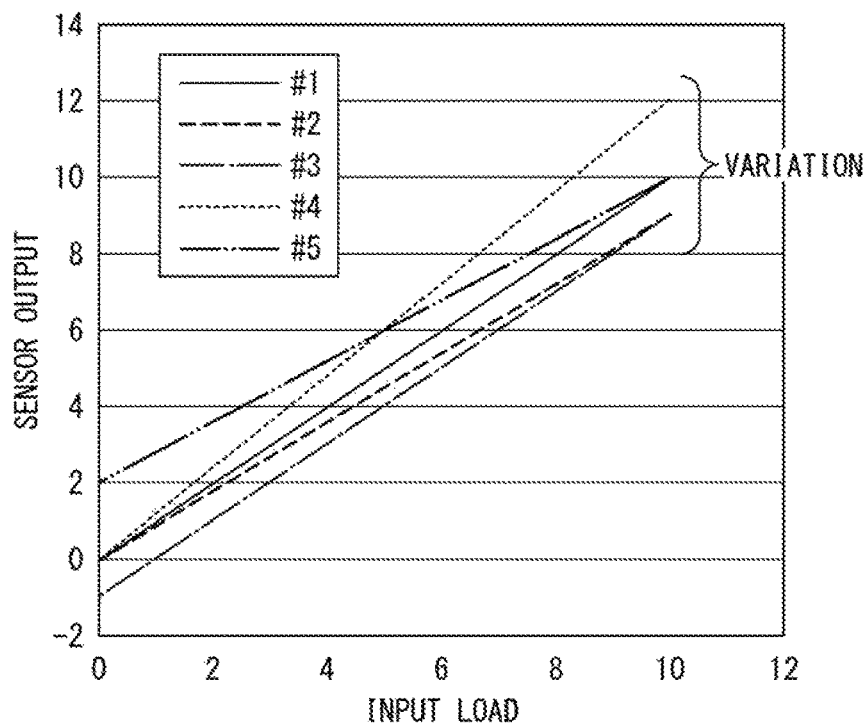
FIG. 5 is a graph showing an example of sensor characteristics having variation.

FIG. 5 shows output characteristics of each unit cell 13 for the same input load. Output #2 of a unit cell 13 having high line resistance is less than output #1 of a standard unit cell 13.

Furthermore, in the operation of this array-type sensor, a detected current includes manufacturing variations in all components included in a current path, such as the sensor elements 14, the select transistors 15 and the second selector/driver 17, and offset current due to wraparound from other elements.

Outputs #3 to #5 including such manufacturing variations and offset current vary with respect to standard sensor output #1 as shown in FIG. 5.

Since such variations cause sensor accuracy to decrease, uniform sensor outputs need to be obtained. To improve such uniformity, it is necessary to make a large amount of investment and develop a precise manufacturing technology.

In addition, to reduce a read error due to a line length difference, a technique of using a constant current source during a read operation, additionally providing a second selector/driver for reading on the side opposite to the second selector/driver 17 and measuring potentials of bit lines as in a 4-terminal method may also be conceived. However, only variation in line resistance is compensated for and errors due to manufacturing variations in the sensor elements 14, the select transistors 15 and the like are not compensated for although the circuit becomes complicated.

In an array-type sensor, variation considerably affects the accuracy of detected information and also greatly affects a gradation range of two-dimensional information desired to be detected.

Figure 6:
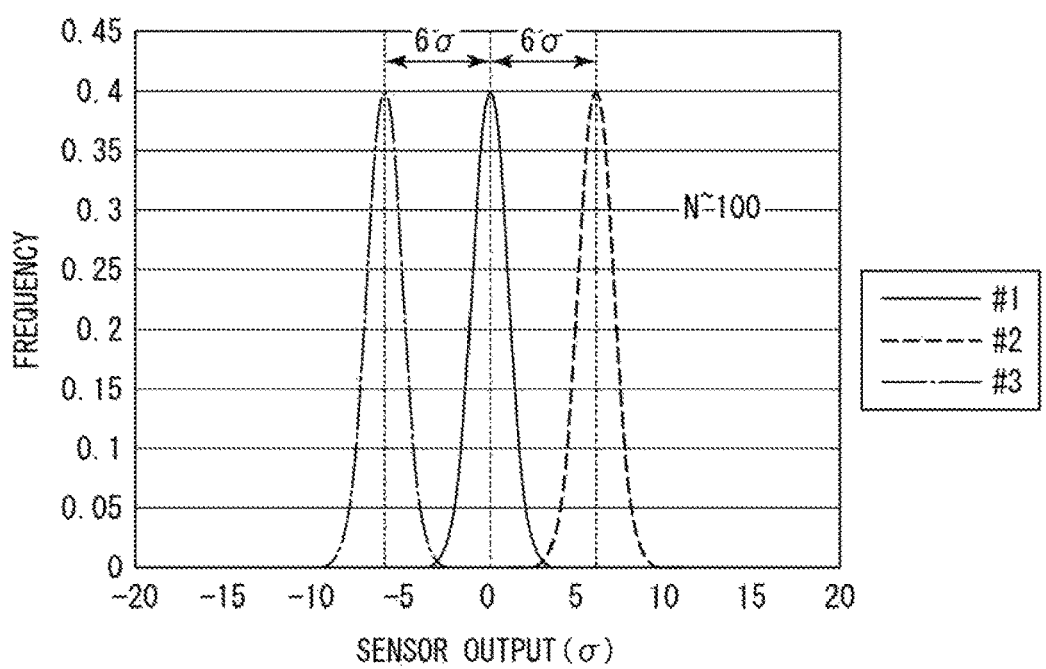
FIG. 6 is a diagram showing a gradation range based on a sensor characteristic σ when a degree of integration of sensors is about 100.

For example, if the number of sensors (the number of unit cells) is about 100, it is necessary to consider an output signal distribution range of about ±3σ. Accordingly, a gradation representation range of about 6σ is required (FIG. 6).

In a gradation range equal to or less than this, the bottoms of distributions of sensor output characteristics overlap and thus sensor responses to the same input load may be reversely represented.

Figure 7:
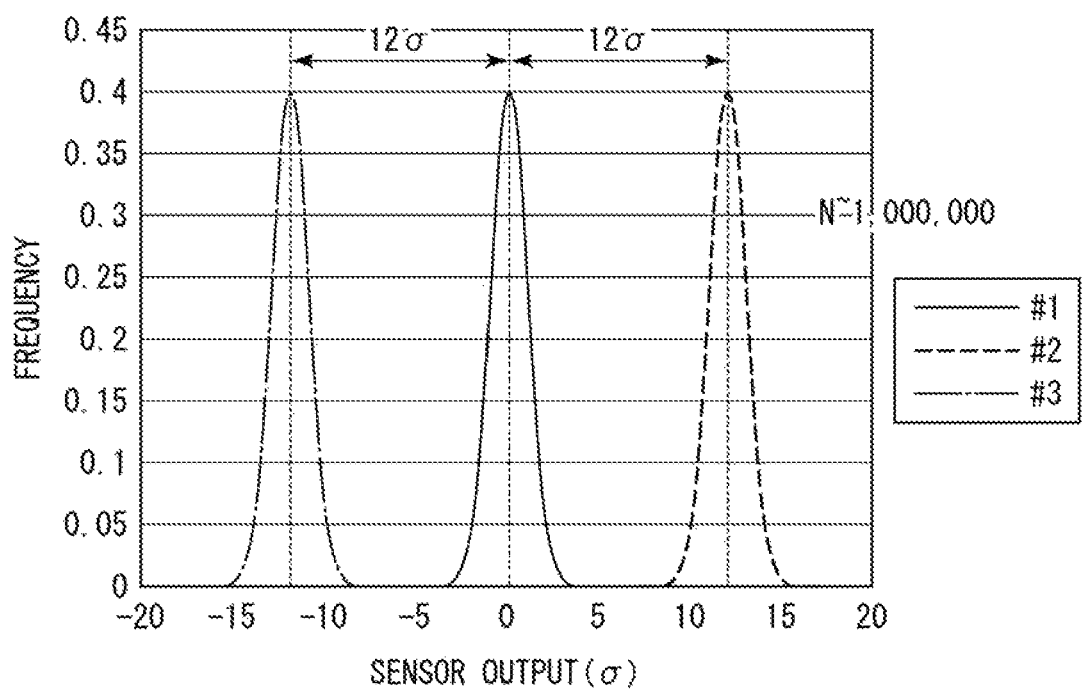
FIG. 7 is a diagram showing a gradation range based on a sensor characteristic σ when a degree of integration of sensors is 1,000,000.

A distribution range that needs to be considered is ±4σ if the number of sensors (the number of unit cells) is about 1,000 and ±6σ if 1,000,000. Accordingly, meaningful gradation ranges increase to 8σ and 12σ, respectively. That is, if σ is constant, meaningful gradation ranges increase and become coarse when sensor integration increases (FIG. 7).

Furthermore, in an array-type sensor sheet having higher sensor integration and a larger area, as described above, variation generally tends to increase due to the influence of place dependency of line resistance and place dependency of the sensor elements 14 and the select transistors 15 during manufacturing processes.

Although it is considered that the effectiveness of an array-type sensor increases as the number of integrated sensors increases, it is necessary to decrease σ corresponding to output variation in order to secure a gradation range and thus demand for a manufacturing technology therefore is considerably higher.

In contrast, the array-type sensor 1 of the present embodiment corrects sensor outputs in consideration of such variation and the present embodiment is particularly effective for the large-scale array-type sensor 1 having a large number of integrated sensors.

In the present embodiment, the array-type sensor 1 includes the nonvolatile storage device 19 which stores correction information.

Accordingly, the array-type sensor 1 stores outputs including the outputs of the sensor element 14 and the select transistor 15, and line resistances and the like of each unit cell 13 as reference data in the nonvolatile storage device 19 in advance with respect to standard loads of two or more points in the calibration mode. Accordingly, the array-type sensor 1 performs an operation on corrected results on the basis of the stored reference data and outputs the results in the measurement mode. As a result, the array-type sensor 1 can improve the accuracy of sensor outputs and achieve uniform sensor outputs in the respective cells.

Accordingly, it is possible to acquire two-dimensional physical information with a narrower gradation range to obtain more useful two-dimensional information in the array-type sensor 1.

In addition, the array-type sensor 1 performs calibration for change in output due to deterioration over time by performing regular calibration using the calibration mode. Accordingly, the life of the array-type sensor 1 can be increased.

Furthermore, the array-type sensor 1 of the present embodiment includes the select transistor 15 in each unit cell 13. Accordingly, the array-type sensor 1 electrically disconnects other non-selected sensor elements 14 and thus is not affected by stray current in the array. Therefore, it is possible to obtain stabilized sensor outputs regardless of resistance states of the non-selected sensor elements 14.

For example, when an array-type pressure sensor is configured as the array-type sensor 1, it is possible to measure pressures at multiple points and generate a pressure map by sequentially scanning unit cells.

Addition of components such as transistors to the current path in the array-type sensor 1 causes increase in sensor output variation. However, in the array-type sensor 1 of the present embodiment, output with calibration is performed with respect to all causes of error such as variation in the sensor elements 14, variation in the select transistors 15 and variation in line resistance using reference data stored in advance in the nonvolatile storage device 19.

Accordingly, the accuracy of sensor outputs is improved.

In addition, it is possible to reduce a gradation range of a two-dimensional map of sensor outputs by effectively decreasing variation in the outputs of sensors constituting the array, and thus the usefulness of acquired two-dimensional data is improved.

MODIFIED EXAMPLES

In the present embodiment, sensor elements 14 having a resistance value varying with respect to an input load is used.

As a modified example, sensor elements which generate an electromotive force with respect to an input load may be used. The same effects are also obtained for sensor elements which generate an electromotive force for a load.

In this case, a word line 11 is selected through the first selector/driver 16 to cause the select transistor 15 of a target unit cell to be in an ON state. Simultaneously, a target bit line 12 is caused to be in an ON (closed) state through a switch in the second selector/driver 17 and a voltage is read through the read/arithmetic circuit 18.

In addition, unit systems of data stored in the nonvolatile storage device 19 and data output from the read/arithmetic circuit 18 to the outside may be outputs from sensor elements, such as resistance values and electromotive forces or may be converted into input loads. Further, the same effects are also obtained when they are independent digital values used in a signal processing system.

Moreover, when the read/arithmetic circuit 18 can perform read/arithmetic processing on a plurality of sensor outputs in parallel, the second selector/driver 17 may simultaneously cause the plurality of bit lines to be in an ON state. In this case, the outputs of a plurality of sensors connected to the same word line can be simultaneously detected and a time required to scan the entire array is less according to concurrency and thus more dynamic two-dimensional information can be obtained.

Although the drains of the respective select transistors 15 are connected to the bit lines 12 in the present embodiment, the sources of the select transistors 15 may be connected to the bit lines 12 according to circuit configurations of select transistors and sensor elements and a select transistor type in a modified example.

The array-type sensor 1 and the control apparatus 2 are integrated in one body in the present embodiment. Furthermore, the control apparatus 2 includes the first selector/driver 16, the second selector/driver 17, the read/arithmetic circuit 18 and the nonvolatile storage device 19 in one body.

As a modified example, at least one of the first selector/driver 16, the second selector/driver 17, the read/arithmetic circuit 18 and the nonvolatile storage device 19 may be configured such that it is separate from the array-type sensor 1 and is electrically connectable to the array-type sensor 1 when it is used.

Each unit cell 13 of the present embodiment includes the sensor element 14 and the select transistor 15. As a modified example, at least a part of the unit cell 13 may be a printed pattern. For example, each terminal of the sensor element 14 and each electrode of the select transistor 15 may be formed as printed patterns.

Second Embodiment

Hereinafter, a second embodiment of an array-type sensor will be described.

In the first embodiment, sensor outputs when there is no load and when there is a reference input load are stored in the nonvolatile storage device 19 and used for an operation for correcting sensor outputs.

Although the array-type sensor of the present embodiment is basically the same as in the first embodiment, it differs from the first embodiment in that each operation uses a function and a lookup table.

In the present embodiment, when sensor response characteristics (sensor outputs) with respect to each input load are linear, for example, the same effects are also obtained when a slope and an intercept of a primary straight line representing these sensor characteristics are stored and used for operations. Further, in sensors which require a dynamic range, and the like, for example, sensor outputs depending on a logarithm of an input load may be required. Even in the case of such response characteristics, parameters which uniquely define a function may be stored in the nonvolatile storage device and used for operations when the sensor response characteristics are output if a function system which can describe the sensor response characteristics with respect to input loads is clarified. In addition, when parameters which uniquely define a function are stored and used, as described above, it is possible to further improve the accuracy and reliability of sensor outputs if a regression line or a regression curve is obtained and function parameters are determined with respect to a plurality of reference input loads of three or more points in the calibration mode.

When sensor characteristics cannot be defined by a general simple function, the respective sensor outputs may be stored in the nonvolatile storage device 19 in the form of a lookup table with respect to a plurality of reference input loads of three or more points. When sensor outputs are output, the sensor outputs can be compensated, corrected and output with reference to the lookup table to be used for improvement of the accuracy of sensor outputs having various characteristics.

Third Embodiment

Hereinafter, a third embodiment of an array-type sensor will be described with reference to FIG. 8.

Although the array-type sensor of the present embodiment is basically the same as the first embodiment, the array-type sensor of the present embodiment differs from the first embodiment in that it includes sensor elements of two or more types having different functions.

A sensor mounted in an array-type sensor is not limited to a single sensor. For example, various sensors such as pressure, temperature, illumination and humidity sensors can be mounted and used as sensor elements 114 as in an array-type sensor 101 of the present embodiment.

The array-type sensor 101 of the present embodiment includes the control apparatus 2, an array part 103, the word lines 11 (first lines), and the bit lines 12 (second lines).

Figure 8:
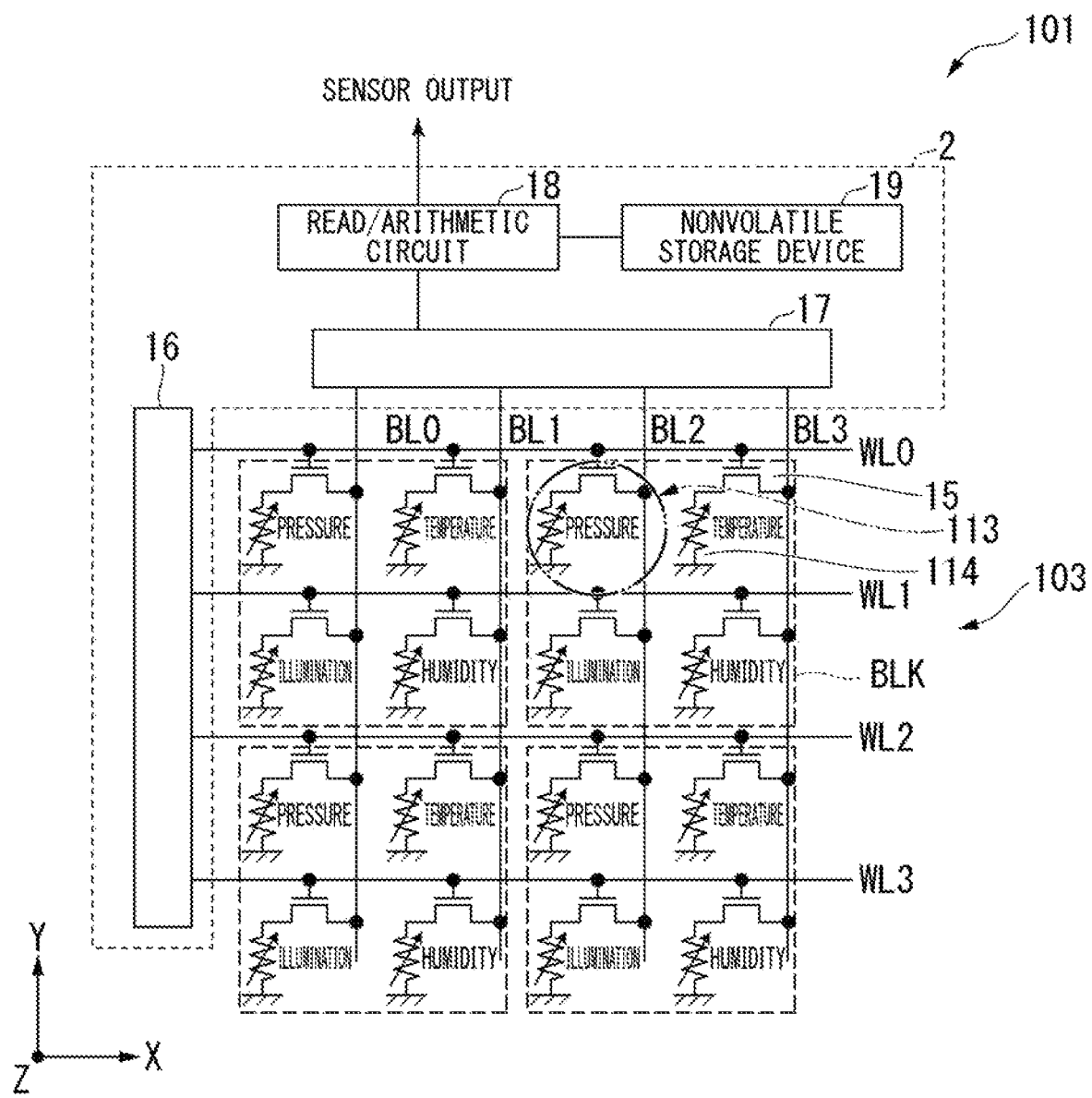
FIG. 8 is a schematic diagram of an array-type sensor according to a third embodiment.

As shown in FIG. 8, the array part 103 has sixteen unit cells 113 in the present embodiment. The unit cells 113 are two-dimensionally arranged in four lines in the X direction and four lines in the Y direction.

Each unit cell 113 includes a sensor element 114 and the select transistor 15.

The sixteen unit cells 113 form a plurality of unit blocks BLK. Each unit block BLK includes four unit cells 113 neighboring in two lines in the X direction and in two lines the Y direction.

The unit cells 113 in each unit block BLK have different functions.

In the present embodiment, the four unit cells 113 in each unit block BLK include sensor elements 114 having different functions and respectively have a pressure sensor, a temperature sensor, an illumination sensor and a humidity sensor.

That is, the unit blocks BLK can be configured using a plurality of unit cells 113 including multiple types of sensor element having different functions like an RGB color liquid crystal TFT display (FIG. 8). A sensor output of each unit cell 113 is stored as reference data in advance in the nonvolatile storage device 19 in the calibration mode. Accordingly, corrected sensor outputs with high accuracy are output from the control apparatus 2 to the outside in the measurement mode.

In this array-type sensor 101, it is possible to measure distributions of pressure, temperature, illumination and humidity with high accuracy. When the array-type sensor 101 is installed on the floor of a large hall, it is possible to detect persons or the number of persons using the pressure sensor and measure the illumination, temperature and humidity in that place. It is possible to selectively adjust the lighting and air conditioning at only a place where there are persons on the basis of such information to provide an environment that achieves both comfort and energy saving.

The array-type sensor 101 includes the select transistors 15 in the unit cells 113, and thus respective sensor elements can electrically independently operate and excellent calibration can be performed for the respective sensors. Accordingly, the array-type sensor 101 can obtain two-dimensional information with high accuracy even over a large area.

MODIFIED EXAMPLES

In the array-type sensor 101, sensor elements which detect different physical quantities are combined. As a modified example, sensor elements which have different detection ranges while detecting the same physical quantity may be combined.

For example, the four unit cells 113 in each unit block BLK may include sensor elements having different detection ranges.

When sensor characteristics are linear with respect to input loads, it is difficult to increase a dynamic range. In the case of an input load which is small for a detection range, an error is significant. Further, in the case of a large input, an error is likely to deviate from an input range.

In such a case, it is possible to acquire correct outputs for both a small input load and a large input load by combining sensor elements having different operation ranges to form the unit blocks BLK.

Fourth Embodiment

Hereinafter, a fourth embodiment of an array-type sensor will be described with reference to FIG. 9 to FIG. 12.

Although the array-type sensor of the present embodiment is basically the same as the first embodiment, it differs from the first embodiment in that a single-wall carbon nanotube layer is used.

Carbon nanotube (CNT) is a cylindrical carbon molecule composed of only carbon and has a structure in which a graphene sheet composed of six-membered rings of carbon atom is rolled. CNT formed by rolling one graphene sheet into a cylindrical shape is called a single-wall nanotube (SWNT). The diameter of the SWNT is about 1 nm.

In the SWNT, there are various carbon nanotubes having different helicity (chirality) according to different graphene sheet rolling directions, that is, different carbon atom six-membered ring alignments in the circumferential direction. Accordingly, both of a metallic property and a semiconductor property appear according to different helicity (chirality).

Among SWNTs having such features, a layer formed by coating or printing a dispersion liquid appropriately adjusted by increasing a content ratio of a semiconducting SWNT can be used as a semiconductor layer of a TFT. SWNT was used as a semiconductor layer and a TFT array 71 was manufactured on a plastic film using a printing method.

Figure 9:
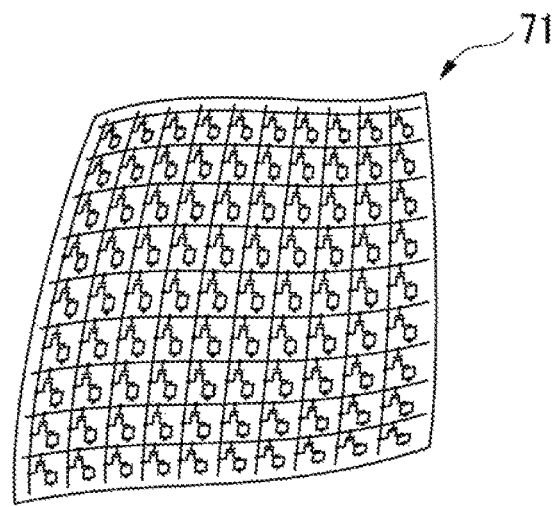
FIG. 9 is a perspective view of a TFT array according to a fourth embodiment.

FIG. 9 shows a 16×16 TFT array 71 having SWNT as a semiconductor layer. Since the SWNT was used as the semiconductor layer, field effect mobility of carriers is 4.1 $cm^2/Vs$ which was higher than that of a TFT using general amorphous Si as a semiconductor layer. On/off (on/off current ratio) is $10^6$ which is suitable for select transistors of unit cells. However, variation in on current is about 30% which is larger characteristics variation than that of a general transistor manufactured through photolithography.

Figure 10:
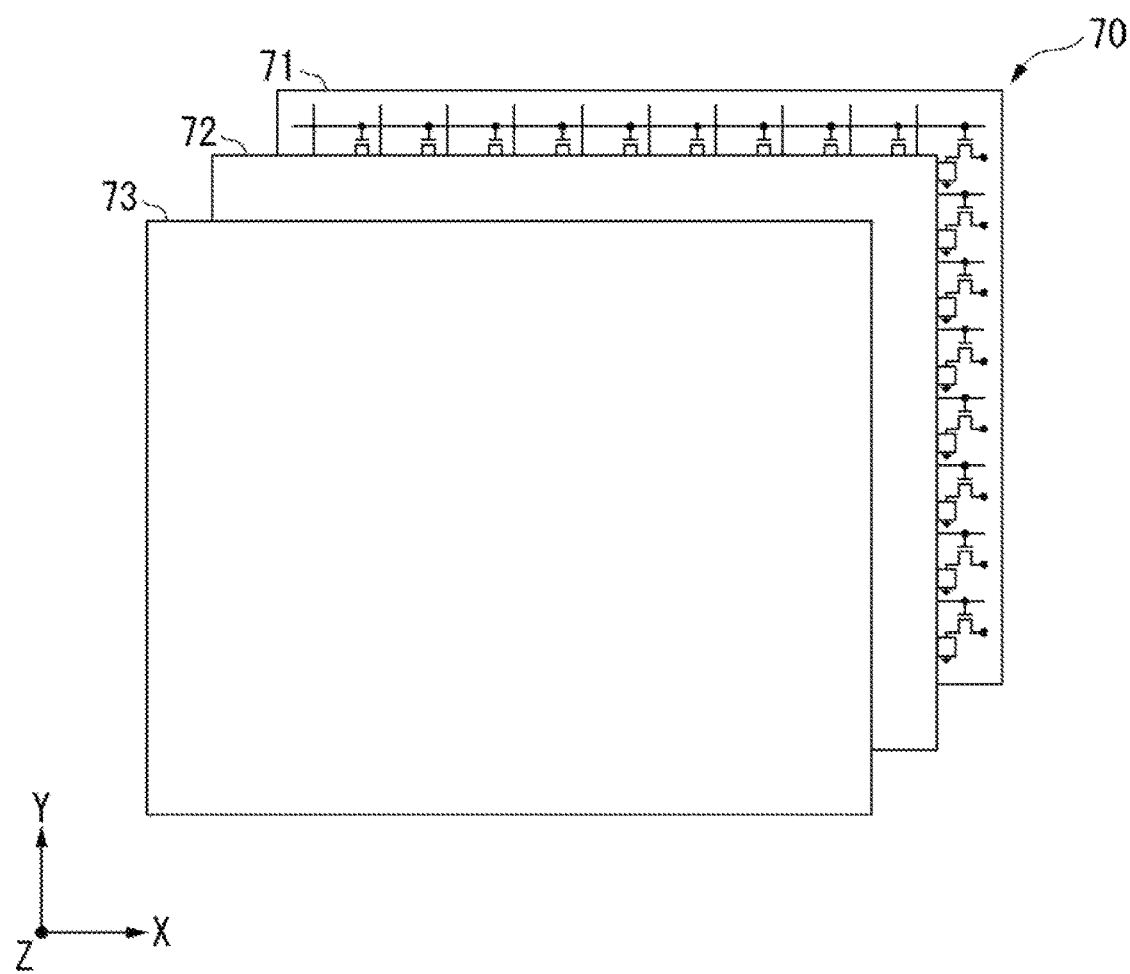
FIG. 10 is an exploded view of an array part according to the fourth embodiment.

A pressure-sensitive conductive rubber 72 and an aluminum foil 73 are superimposed on the TFT array 71 using the SWNT to assemble an array-type pressure-sensitive sensor 70 (FIG. 10).

In the equivalent circuit diagram of the unit cell 13 shown in FIG. 3, the pressure-sensitive conductive rubber 72 corresponds to the variable resistance type sensor element 14 and the resistance value thereof decreases when it is deformed according to pressure applied thereto. In addition, the aluminum foil 73 corresponds to the ground GND of each unit cell 13.

Figure 11:
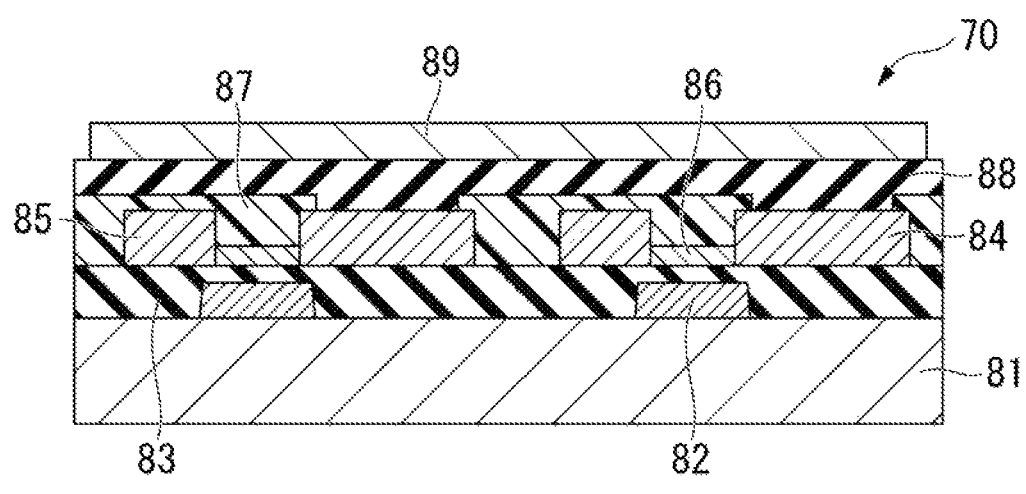
FIG. 11 is a cross-sectional view of the array part according to the fourth embodiment.
Figure 11:
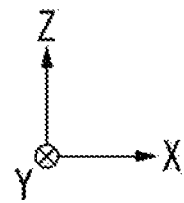

FIG. 11 shows an example of a cross-sectional structure of the array-type pressure-sensitive sensor 70.

A plurality of gate electrodes 82 are formed on a film substrate 81.

The gate electrodes 82 are electrically connected to the word lines 11.

Further, a gate insulating layer 83 is formed to cover the gate electrodes 82.

A plurality of pairs of a source electrode 84 and a drain electrode 85 are disposed having a distance according to a channel length therebetween on the gate insulating layer 83.

The drain electrodes 85 are electrically connected to the bit lines 12 and faces the gate electrodes 82 on the gate insulating layer 83, and a plurality of SWNT channels 86 formed of SWNT are disposed to be electrically connected to the source electrodes 84 and the drain electrodes 85.

Further, an insulating resin layer 87 is provided to come into contact with the SWNT channels 86. The insulating resin layer 87 is formed to cover the drain electrodes 85 and the SWNT channels 86 and portions of the source electrodes 84 are opened.

Openings of the source electrodes 84 are electrically connected to a pressure-sensitive conductive rubber sheet 88 and a metal foil 89 is laminated on the pressure-sensitive conductive rubber sheet 88, and thus the metal foil 89 is electrically connected to the ground GND.

Figure 12:
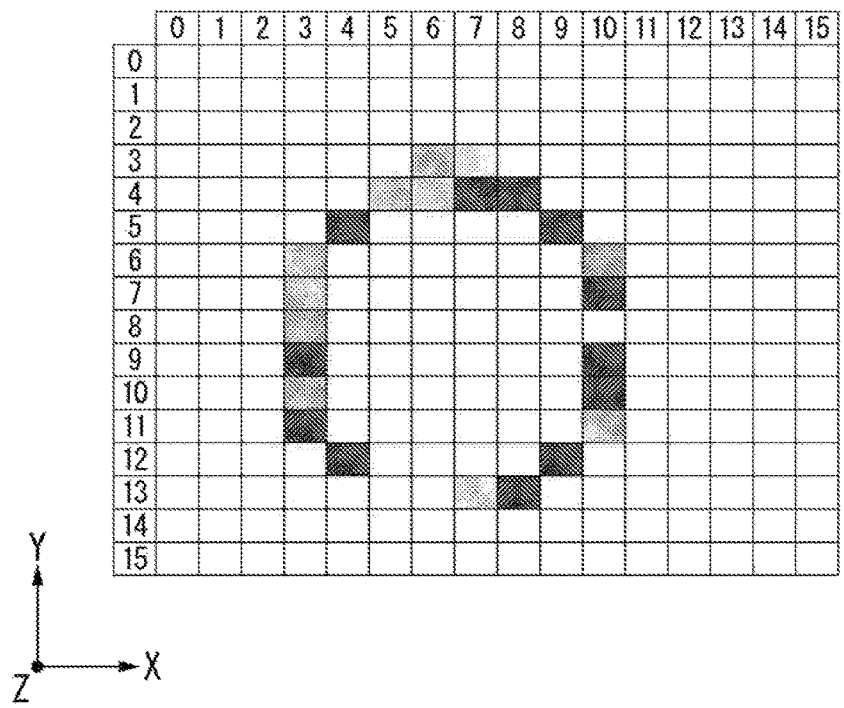
FIG. 12 is a two-dimensional pressure map measured using an array-type pressure sensor when a calibration function is not used.

A pressure map when a weight having the bottom face protruded in a ring shape is placed on the array-type pressure-sensitive sensor 70 is shown in FIG. 12. Although the protrusion in a ring shape on which pressure is concentrated is nearly detected, gradation representation is disordered and a part of the detected ring is missed. This is chiefly caused by large characteristics variation in TFTs manufactured using a printing method.

Figure 13:
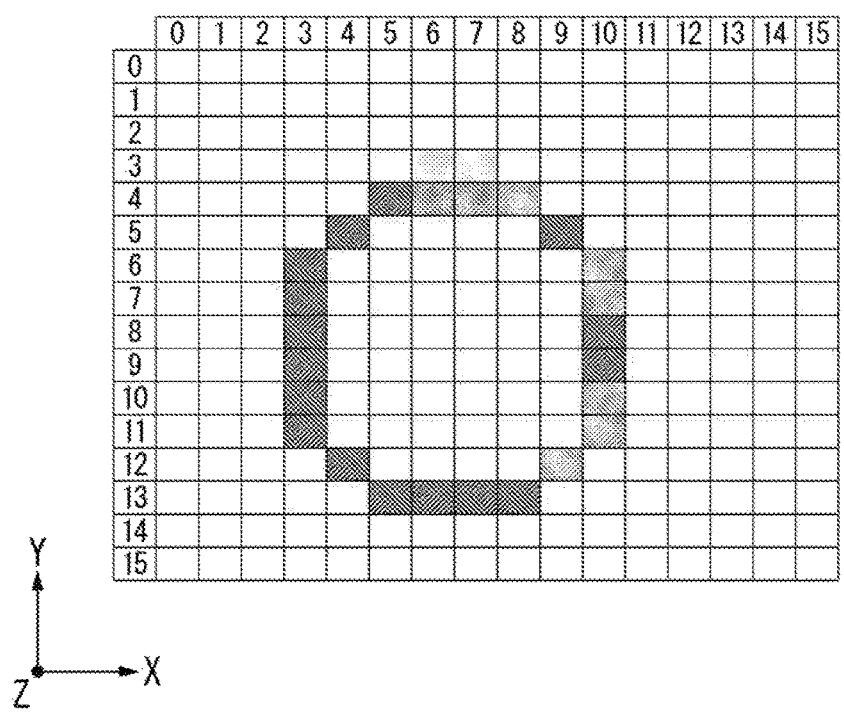
FIG. 13 is a two-dimensional pressure map measured using the array-type pressure sensor when the calibration function is used.

Next, a pressure map obtained by applying the calibration mode and the measurement mode of the first embodiment to the array-type pressure-sensitive sensor 70 and correcting sensor outputs using reference data is shown in FIG. 13. Even dispersion of pressure appears in a portion across two pixels and thus it can be ascertained that a high-accuracy two-dimensional pressure image is acquired. In this manner, the present embodiment is considerably effective to exclude the influence of element variation in the array-type sensor and acquire a high-accuracy two-dimensional sensor output map.

In addition, SWNT is used for a semiconductor layer in the select transistors of the unit cells used in the present embodiment. The select transistors using the SWNT have high field effect mobility and can operate at a high speed. Accordingly, they can scan respective sensors at a high speed to obtain dynamic two-dimensional sensor information even when the array scale of the array-type sensor increases. In addition, the SWNT transistor arrays are manufactured through a printing method. In the printing method, deposition and patterning of a material are simultaneously performed and thus a manufacturing process is shorter than conventional semiconductor manufacturing. Furthermore, since the printing method can manufacture elements using minimum necessary materials and does not use a vacuum device, it is suitable to manufacture a considerably large array-type sensor having a super large area.

Although the TFT array 71 is formed on the plastic film in the present embodiment, at least some of the unit cells of the TFT array 71 may be formed on the plastic film in a modified example.

Fifth Embodiment

Hereinafter, a fifth embodiment of an array-type sensor will be described with reference to FIG. 14.

Although the array-type sensor of the present embodiment is basically the same as the first embodiment, it differs from the first embodiment in that a film substrate is used.

The present embodiment is effective for an array-type sensor sheet having a super large area formed on a plastic film or the like through the printing method or the like.

Figure 14:
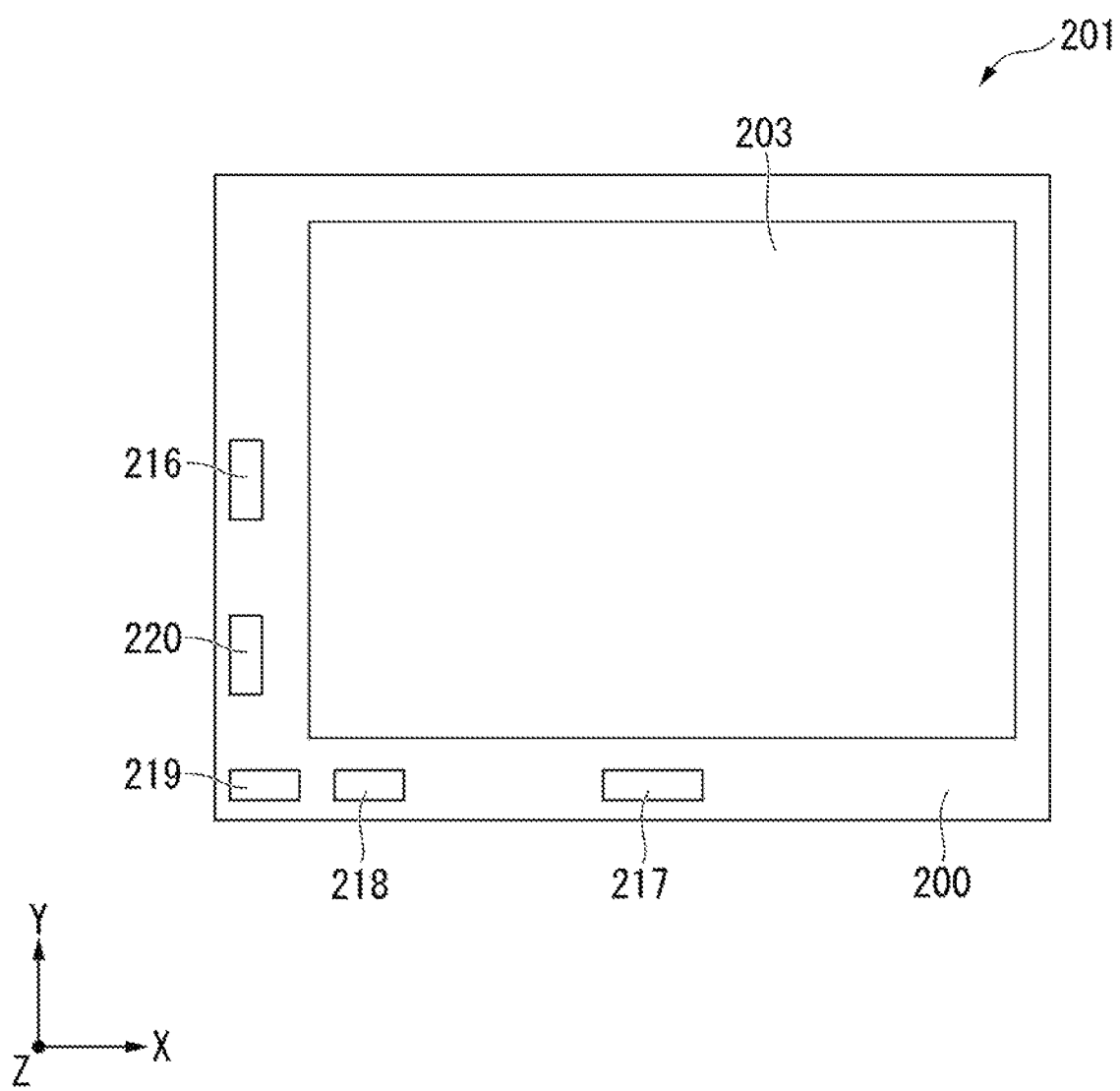
FIG. 14 is a plan view of an array-type sensor according to a fifth embodiment.

Next, an array-type sensor 201 of the present embodiment is shown in FIG. 14.

In the present embodiment, a large-area film on which respective unit cells are formed in an array is used.

An array part 203 having respective unit cells is formed on a film substrate 200. Silicon semiconductors which execute functions of a first selector/driver 216, a second selector/driver 217, a read/arithmetic circuit 218, and a nonvolatile storage device 219 for storing reference data are mounted around the array part 203 on the film substrate 200 and they are electrically connected respectively. Further, a subsidiary peripheral circuit 220 having a power control function or a communication function such as wireless communication may be mounted.

In general, a TFT formed on a plastic film or the like has a thick gate insulating layer and a high driving voltage. Although operation processing necessary for an array-type sensor may be performed using transistors manufactured through the same manufacturing process as that for select transistors of unit cells, power consumption necessary for the operation processing increases. Furthermore, the definition of a manufacturing process used to manufacture select transistors of unit cells is lower than that of a general silicon semiconductor device process and data processing capability is not high.

In the present embodiment, circuit blocks which require operations, such as the first selector/driver 216, the second selector/driver 217 and the read/arithmetic circuit 218, are manufactured using a general silicon semiconductor, are mounted on the film on which select transistors are formed and are electrically connected.

The first selector/driver 216, the second selector/driver 217, the read/arithmetic circuit 218 and the like manufactured using a general silicon semiconductor have small sizes and, as shown in FIG. 14, they can be mounted on the film and hardly increase in physical size.

It is possible to reduce operation processing time, power consumption, manufacturing cost, and the like by employing the above-described form. In addition, when this form is employed, a flash memory or the like which is inexpensive and easily secures capacity can be mounted as the nonvolatile storage device 219. As a result, cost increasing in order to secure calibration data can be reduced. Furthermore, it is possible to improve convenience of the array-type sensor by mounting a chip including a subsidiary peripheral circuit having a power control function or a communication function such as wireless communication.

Sixth Embodiment

Hereinafter, a sixth embodiment of an array-type sensor will be described.

Although the array-type sensor 1 of the present embodiment is basically the same as the first embodiment, it differs from the first embodiment in that the calibration mode is regularly executed and reference data stored in the nonvolatile storage device is rewritten and used in the array-type sensor 1.

A large array-type sensor is used by being incorporated in social infrastructures such as buildings and roads, apparatuses, and the like. In such a case, the life according to deterioration over time becomes a problem.

In the present embodiment, the calibration mode is regularly executed, reference data stored in the nonvolatile storage device is rewritten and the array-type sensor 1 is used.

In the present embodiment, first, initial calibration is performed before or when the array-type sensor is installed. The array-type sensor is caused to be in the calibration mode and the outputs of all sensor elements are read and stored in the nonvolatile storage device 19 in an initial no-load state, for example.

Next, a reference input load, for example, is applied to each sensor element 14 and the outputs of all sensor elements are stored in the nonvolatile storage device 19 again.

In the measurement mode, the read/arithmetic circuit 18 performs an operation on a raw output from each sensor element 14 on the basis of sensor outputs acquired when no load is applied and when the reference input load is applied and stored in advance in the nonvolatile storage device 19, and corrected sensor outputs are output to the outside.

When the array-type sensor is used for a certain period, original sensor outputs may not be acquired due to deterioration over time. Sensor outputs also change when some characteristics of the sensor elements 14, the select transistors 15 of the unit cells 13 and line resistance change. Even in this case, the array-type sensor 1 can perform re-calibration.

After a lapse of certain period from installation in an infrastructure, an apparatus or the like, the array-type sensor is caused to be in the calibration mode again and the outputs of all sensor elements are read and stored in the nonvolatile storage device 19 again in an initial no-load state, for example. Subsequently, a reference input load, for example, is applied to each sensor element 14 and the outputs of all sensor elements 14 are stored in the nonvolatile storage device 19. As a result, sensor outputs can be returned to normal values and the service life of the array-type sensor 1 can be improved.

Modified Example

In the present embodiment, sensor outputs when no load is applied and when a reference input load is applied are stored in the nonvolatile storage device 19 as reference data. As a modified example, a regular calibration mode may be applied when correction is performed using parameters which uniquely define a function that can describe sensor response characteristics or a lookup table, as described in the second embodiment. Even when correction is performed using parameters which uniquely define a function that can describe sensor response characteristics or a lookup table, the same effects are obtained and the service life of the array-type sensor can be improved.

In the third to fifth embodiments, the regular calibration mode may be executed in the same manner.

In each of the above-described embodiments, a program for realizing all or some functions of the control apparatus may be recorded in a computer-readable recording medium, and processing each component may be performed by a computer system reading and executing the program recorded in this recording medium. Meanwhile, the "computer system" mentioned here is assumed to include an OS and hardware such as peripheral apparatuses.

In addition, the "computer system" is assumed to also include a homepage providing environment (or a display environment) if the WWW system is used.

Furthermore, the "computer-readable recording medium" refers to a portable medium such as a flexible disc, a magneto-optical disc, a ROM or a CD-ROM, or a storage device such as a hard disk included in a computer system. Moreover, the "computer-readable recording medium" is assumed to include a medium which dynamically stores a program for a short time like a communication line when a program is transmitted through a network such as the Internet or a communication link such as a telephone circuit and a medium which stores a program for a certain time like a nonvolatile memory in a computer system which serves as a server or a client in such a case. Further, the program may be a program for realizing some of the above-described functions or a program capable of realizing the above-described functions in combination with a program that has already been recorded in a computer system.

While embodiments of the present invention have been described with reference to the drawings, specific configurations are not limited to the above-described embodiments and also include design change without departing from the spirit or scope of the present invention.

Some or all of the above-described embodiments may be described as supplementary notes below but are not limited thereto.

(Supplementary Note 1) A control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, wherein sensor outputs of the respective unit cells with respect to two or more reference inputs are stored as the reference data in the nonvolatile storage device in a calibration mode, and a correction operation is performed on the sensor outputs of the respective unit cells using the reference data stored in the nonvolatile storage device and results of the correction operation are output in a measurement mode.

(Supplementary Note 2) The control apparatus according to supplementary note 1, wherein the first lines and the second lines are disposed in an intersecting manner orthogonally.

(Supplementary Note 3) The control apparatus according to supplementary note 1 or 2, wherein the nonvolatile storage device is configured to store parameters which include coefficients of respective terms of a function representing sensor output characteristics and uniquely determine the function.

(Supplementary Note 4) The control apparatus according to supplementary note 1 or 2, wherein the nonvolatile storage device has a lookup table, and is configured to store sensor outputs of the respective unit cells for the reference inputs of three or more points as the lookup table in the calibration mode, and compensate and output the sensor outputs of the respective unit cells with reference to the lookup table in the measurement mode.

(Supplementary Note 5) The control apparatus according to any one of supplementary notes 1 to 4, wherein a plurality of unit cells having different functions are formed using sensor elements of two or more types having different functions as the unit cells, and the plurality of unit cells having different functions are two-dimensionally arranged.

(Supplementary Note 6) The control apparatus according to any one of supplementary notes 1 to 5, wherein semiconductor materials of the select transistors include a single-wall carbon nanotube.

(Supplementary Note 7) The control apparatus according to any one of supplementary notes 1 to 6, wherein at least one of the first selector/driver, the second selector/driver, the read/arithmetic circuit, and the nonvolatile storage device is separate from the array-type sensor and is electrically connectable to the array-type sensor when used.

(Supplementary Note 8) The control apparatus according to any one of supplementary notes 1 to 7, wherein at least parts of the unit cells are printed patterns.

(Supplementary Note 9) The control apparatus according to any one of supplementary notes 1 to 8, wherein at least parts of the unit cells are formed on a plastic film.

(Supplementary Note 10) The control apparatus according to any one of supplementary notes 1 to 9, wherein the nonvolatile storage device is a nonvolatile memory.

(Supplementary Note 11) An array-type sensor including the control apparatus according to any one of supplementary notes 1 to 10, the array part, the first lines, and the second lines.

(Supplementary Note 12) A sensor usage method for regularly operating in the calibration mode and rewriting the reference data stored in the nonvolatile storage device in the array-type sensor according to supplementary note 11.

(Supplementary Note 13) A control method of a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read the outputs of the respective unit cells and perform a correction operation on the outputs; and a nonvolatile storage device which is configured to store reference data, the control method executing: a calibration step of storing sensor outputs of the respective unit cells with respect to two or more reference inputs as the reference data in the nonvolatile storage device in a calibration mode; and a measurement step of performing a correction operation on the sensor outputs of the respective unit cells using the reference data stored in the nonvolatile storage device and outputting results of the correction operation in a measurement mode.

(Supplementary Note 14) A program causing a computer of a control apparatus which is configured to control an array-type sensor including an array part in which unit cells having sensor elements and select transistors are two-dimensionally arranged, a plurality of first lines connected to gates of the select transistors, and a plurality of second lines connected to one of sources anti drains of the select transistors, the control apparatus including: a first selector/driver which is configured to select and drive one of the plurality of first lines; a second selector/driver which is configured to select and drive at least one of the plurality of second lines; a read/arithmetic circuit which is configured to read the outputs of the respective unit cells and perform a correction operation on the outputs; and a nonvolatile storage device which is configured to store reference data, to execute: a calibration step of storing sensor outputs of the respective unit cells with respect to two or more reference inputs as the reference data in the nonvolatile storage device in a calibration mode; and a measurement step of performing a correction operation on the sensor outputs of the respective unit cells using the reference data stored in the nonvolatile storage device and outputting results of the correction operation in a measurement mode.

INDUSTRIAL APPLICABILITY

The aforementioned control apparatus, array-type sensor, sensor usage method, control method and program allow uniform outputs of respective cells of an array-type sensor to be obtained.

REFERENCE SYMBOLS

1 Array-type sensor
2 Control apparatus
3 Array part
11 Word line (first line)
12 Bit line (second line)
13 Unit cell
14 Sensor element
15 Select transistor
16 First selector/driver
17 Second selector/driver
18 Read/arithmetic circuit
19 Nonvolatile storage device
70 Array-type pressure-sensitive sensor
71 Array
72 Pressure-sensitive conductive rubber
73 Aluminum foil
81 Film substrate
82 Gate electrode
83 Gate insulating layer
84 Source electrode
85 Drain electrode
86 SWNT channel
87 Insulating resin layer
88 Pressure-sensitive conductive rubber sheet
89 Metal foil
101 Array-type sensor
103 Array part
113 Unit cell
114 Sensor element
200 Film substrate
201 Array-type sensor
203 Array part
216 First selector/driver
217 Second selector/driver
218 Arithmetic circuit
219 Nonvolatile storage device
220 Subsidiary peripheral circuit
BLK Unit block
GND Ground

The invention claimed is:

1. A control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus comprising:
a first selector/driver which is configured to select and drive one of the plurality of first lines;
a second selector/driver which is configured to select and drive at least one of the plurality of second lines;
a read/arithmetic circuit which is configured to read outputs of the respective unit cells and perform a correction operation on the outputs; and
a nonvolatile storage device which is configured to store reference data,
wherein sensor outputs of the respective unit cells with respect to two or more reference inputs are stored as the reference data in the nonvolatile storage device in a calibration mode,
wherein a correction operation is performed on the sensor outputs of the respective unit cells using the reference data stored in the nonvolatile storage device and results of the correction operation are output in a measurement mode,
wherein a plurality of unit cells having different functions are formed using sensor elements of two or more types having different functions as the unit cells, and
wherein the plurality of unit cells having different functions are two-dimensionally arranged.

2. The control apparatus according to claim 1, wherein the first lines and the second lines are disposed in an intersecting manner orthogonally.

3. The control apparatus according to claim 1, wherein the nonvolatile storage device is configured to store parameters which include coefficients of respective terms of a function representing sensor output characteristics and uniquely determine the function.

4. The control apparatus according to claim 1, wherein the nonvolatile storage device has a lookup table, and is configured to
store sensor outputs of the respective unit cells for the reference inputs of three or more points as the lookup table in the calibration mode, and
compensate and output the sensor outputs of the respective unit cells with reference to the lookup table in the measurement mode.

5. The control apparatus according to claim 1, wherein semiconductor materials of the select transistors include a single-wall carbon nanotube.

6. The control apparatus according to claim 1, wherein at least one of the first selector/driver, the second selector/driver, the read/arithmetic circuit, and the nonvolatile storage device is separate from the array-type sensor and is electrically connectable to the array-type sensor when used.

7. The control apparatus according to claim 1, wherein at least parts of the unit cells are printed patterns.

8. The control apparatus according to claim 1, wherein at least parts of the unit cells are formed on a plastic film.

9. The control apparatus according to claim 1, wherein the nonvolatile storage device is a nonvolatile memory.

10. An array-type sensor comprising:
the control apparatus according to claim 1;
the array part;
the first lines; and
the second lines.

11. A control method of a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus comprising: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, the control method executing:

storing sensor outputs of the respective unit cells with respect to two or more reference inputs as the reference data in the nonvolatile storage device in a calibration mode; and performing a correction operation on the sensor outputs of the respective unit cells using the reference data stored in the nonvolatile storage device and outputting results of the correction operation in a measurement mode, wherein a plurality of unit cells having different functions are formed using sensor elements of two or more types having different functions as the unit cells, and wherein the plurality of unit cells having different functions are two-dimensionally arranged.

12. A non-transitory computer-readable recording medium storing a program causing a computer of a control apparatus which is configured to control an array-type sensor including an array part in which unit cells having sensor elements and select transistors are two-dimensionally arranged, a plurality of first lines connected to gates of the select transistors, and a plurality of second lines connected to one of sources and drains of the select transistors, the control apparatus comprising: a first selector/driver which is configured to select and drive one of the plurality of first lines; a second selector/driver which is configured to select and drive at least one of the plurality of second lines; a read/arithmetic circuit which is configured to read outputs of the respective unit cells and perform a correction operation on the outputs; and a nonvolatile storage device which is configured to store reference data, to execute:

storing sensor outputs of the respective unit cells with respect to two or more reference inputs as the reference data in the nonvolatile storage device in a calibration mode; and performing a correction operation on the sensor outputs of the respective unit cells using the reference data stored in the nonvolatile storage device and outputting results of the correction operation in a measurement mode, wherein a plurality of unit cells having different functions are formed using sensor elements of two or more types having different functions as the unit cells, and wherein the plurality of unit cells having different functions are two-dimensionally arranged.

* * * * *